(12) United States Patent
Ji et al.

(10) Patent No.: US 8,633,379 B2
(45) Date of Patent: Jan. 21, 2014

(54) SOLAR CELL

(75) Inventors: Kwangsun Ji, Seoul (KR); Heonmin Lee, Seoul (KR); Junghoon Choi, Seoul (KR); Hojung Syn, Seoul (KR)

(73) Assignee: LG Electronics Inc., Seoul (KR)

( * ) Notice: Subject to any disclaimer, the term of this patent is extended or adjusted under 35 U.S.C. 154(b) by 127 days.

(21) Appl. No.: 13/211,069

(22) Filed: Aug. 16, 2011

(65) Prior Publication Data

US 2012/0042945 A1 Feb. 23, 2012

(30) Foreign Application Priority Data

Aug. 17, 2010 (KR) .................. 10-2010-0079373
Jul. 29, 2011 (KR) .................. 10-2011-0075777

(51) Int. Cl.
H01L 31/00 (2006.01)

(52) U.S. Cl.
USPC ..................... 136/261; 136/252; 136/258

(58) Field of Classification Search
USPC .................................. 136/256, 258
See application file for complete search history.

(56) References Cited

U.S. PATENT DOCUMENTS

| | | | | |
|---|---|---|---|---|
| 5,977,476 A | * | 11/1999 | Guha et al. ............... | 136/249 |
| 2004/0200520 A1 | | 10/2004 | Mulligan et al. | |
| 2006/0130891 A1 | * | 6/2006 | Carlson ..................... | 136/256 |
| 2007/0169808 A1 | | 7/2007 | Kherani et al. | |
| 2007/0264746 A1 | | 11/2007 | Onishi et al. | |
| 2011/0000532 A1 | * | 1/2011 | Niira et al. ................ | 136/255 |

FOREIGN PATENT DOCUMENTS

| | | |
|---|---|---|
| EP | 1 873 840 A1 | 1/2008 |
| JP | 2010-183080 A | 8/2010 |
| KR | 10-0847741 B1 | 7/2008 |
| KR | 10-0850641 B1 | 8/2008 |
| KR | 10-2011-0020659 A | 3/2011 |
| KR | 10-2011-0026238 A | 3/2011 |
| WO | WO 03/083955 A1 | 10/2003 |
| WO | WO 2009096539 A1 * | 8/2009 ............. H01L 31/06 |

OTHER PUBLICATIONS

A. Poruba et al. "Optical absorption and light scattering in microcrystalline silicon thin films and solar cells". J. Appl. Phys. 88, 148 (2000); doi: 10.1063/1.373635.*

Ma, W et al. "The utilization of microcrystalline Si and SiC for the efficiency improvement in a-Si solar cells". Photovoltaic Energy Conversion, 1994., Conference Record of the Twenty Fourth. IEEE Photovoltaic Specialists Conference—1994, 1994 IEEE First World Conference on , vol. 1, No., pp. 417,420 vol. 1, Dec. 5-9, 1994 doi: 10.1109/WCPEC.1994.519.*

* cited by examiner

*Primary Examiner* — Miriam Berdichevsky
(74) *Attorney, Agent, or Firm* — Birch, Stewart, Kolasch & Birch, LLP (57) ABSTRACT

A solar cell is discussed. The solar cell includes a substrate having a first conductivity type and made of a crystalline semiconductor; an emitter region having a second conductivity type opposite the first conductivity type, and forming a p-n junction with the substrate; a surface field region having the first conductivity type and being separated from the emitter region; a first electrode connected to the emitter region; and a second electrode connected to the surface field region, wherein at least one of the emitter region and the surface field region includes a plurality of semiconductor portions, and at least one of the plurality of semiconductor portion is a crystalline semiconductor portion.

23 Claims, 9 Drawing Sheets

SOLAR CELL

CROSS-REFERENCE TO RELATED APPLICATION

This application claims priority to and the benefit of Korean Patent Application No. 10-2010-0079373 and 10-2011-0075777, filed in the Korean Intellectual Property Office on Aug. 17, 2010 and Jul. 29, 2011, respectively, the entire contents of which are incorporated herein by reference.

BACKGROUND OF THE INVENTION (a) Field of the Invention

Embodiments of the invention relate to a solar cell.

(b) Description of the Related Art

Recently, as exhaustion of existing natural resources such as petroleum and coal is anticipated, interest in alternative energy is increasing, and in this respect, solar cells producing electric power from solar energy are receiving attention.

A solar cell generally includes semiconductor parts that have different conductivity types, such as a p-type and an n-type, and form a p-n junction, and electrodes respectively connected to the semiconductor parts of the different conductivity types.

When light is incident on the solar cell, electron-hole pairs are generated in the semiconductor parts. The electrons move to the n-type semiconductor part and the holes move to the p-type semiconductor part, and then the electrons and holes are collected by the electrodes connected to the n-type semiconductor part and the p-type semiconductor part, respectively. The electrodes are connected to each other using electric wires to thereby obtain electric power.

The electrodes are positioned on the semiconductor part at an incident surface of the solar cell on which light is incident as well as on the semiconductor part at an opposite surface to the incident surface, on which light is not incident. Thus, an incident area of light is reduced by the electrodes positioned on the incident surface to decrease an efficiency of the solar cell.

For increasing the incident area, a back contact solar cell, of which all electrodes are positioned on the opposite surface to the incident surface has been developed.

SUMMARY OF THE INVENTION

In one aspect according to the invention, there is an solar cell including a substrate having a first conductivity type and made of a crystalline semiconductor, an emitter region having a second conductivity type opposite the first conductivity type, and forming a p-n junction with the substrate, a surface field region having the first conductivity type and being separated from the emitter region, a first electrode connected to the emitter region, and a second electrode connected to the surface field region, wherein at least one of the emitter region and the surface field region includes a plurality of semiconductor portions, and a least one of the plurality of semiconductor portions is a crystalline semiconductor portion.

Thee plurality of semiconductor portions may include an amorphous semiconductor portion and the crystalline semiconductor portion.

The amorphous semiconductor portion may be positioned on the substrate, and the crystalline semiconductor portion may be one of positioned between the amorphous semiconductor portion and the first electrode and positioned between the amorphous semiconductor portion and the second electrode.

A surface of the crystalline semiconductor portion, which is in contact with at least one of the first electrode and the second electrode may be an uneven surface of a plurality of protrusions.

The crystalline semiconductor portion may have surface roughness of substantially 1.5 nm to 10 nm.

The plurality of protrusions may have a maximum height of substantially 15 nm to 40 nm.

The crystalline semiconductor portion may be one of microcrystalline silicon and nanocrystalline silicon.

The amorphous semiconductor portion may be have a thickness of about 3 nm to 10 nm.

The crystalline semiconductor portion may have a thickness of about 2 nm to 15 nm.

The crystalline semiconductor portion may have a crystallinity of substantially 10 vol % to 90 vol %.

The solar cell may further include a first buffer region positioned between the emitter region and the substrate and between the surface field region and the substrate.

The emitter region and the surface field region may be positioned on a surface of the substrate, which is opposite to an incident surface of the substrate.

The first buffer region may be further positioned on the substrate between the emitter region and the surface field region.

The first buffer region may be further positioned between the surface field region and the emitter region that are adjacent to each other.

The emitter region may be overlapped with the surface field region and the first buffer region may be positioned between overlapped portions of the emitter region and the surface field region.

The first buffer region may be made of amorphous silicon.

The solar cell may further include a second buffer region positioned on the incident surface.

The second buffer region may be made of a same material as the first buffer region.

The solar cell may further include an anti-reflection layer positioned on the second buffer region.

Each of the emitter region and the surface field region may include the plurality of semiconductor portions, the plurality of semiconductor portions may include an amorphous semiconductor portion and a crystalline semiconductor portion, and a thickness of the crystalline semiconductor portion of the emitter region may differ from a thickness of the crystalline semiconductor portion of the surface field region.

When the first conductivity type may be of an n-type, the thickness of the crystalline semiconductor portion of the surface field region may be greater than the thickness of the crystalline semiconductor portion of the emitter region.

Each of the emitter region and the surface field region may include the plurality of semiconductor portions, the plurality of semiconductor portions may include an amorphous semiconductor portion and a crystalline semiconductor portion, and a thickness of the crystalline semiconductor portion of at least one of the emitter region and the surface field region may differ from a thickness of the amorphous semiconductor portion of the at least one of the emitter region and the surface field region.

The first and second electrodes may be made of a transparent conductive material.

The solar cell may further include a third electrode and a fourth electrode positioned on the first electrode and the second electrode, respectively, and the third and fourth electrodes are made of a conductive material.

The first and second electrodes may be made of conductive metal material.

The solar cell may further include an intrinsic semiconductor interposed between the substrate and the crystalline semiconductor portion.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

(A) of FIG. 6 is a view showing a portion of a second emitter portion of a p-type on a substrate, and a portion of an auxiliary electrode thereon according to an example embodiment of the invention, (B) of FIG. 6 is a view showing a portion of a second BSF portion of an n-type and a portion of an auxiliary electrode thereon according to an example embodiment of the invention, and (C) of FIG. 6 is a showing a portion of amorphous silicon and a portion of an auxiliary electrode thereon when the amorphous silicon is formed on a substrate for an emitter region or an BSF region according to a comparative example.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

A solar cell according to an example embodiment of the invention is described in detail with reference to FIGS. 1 and 2.

Figure 1:
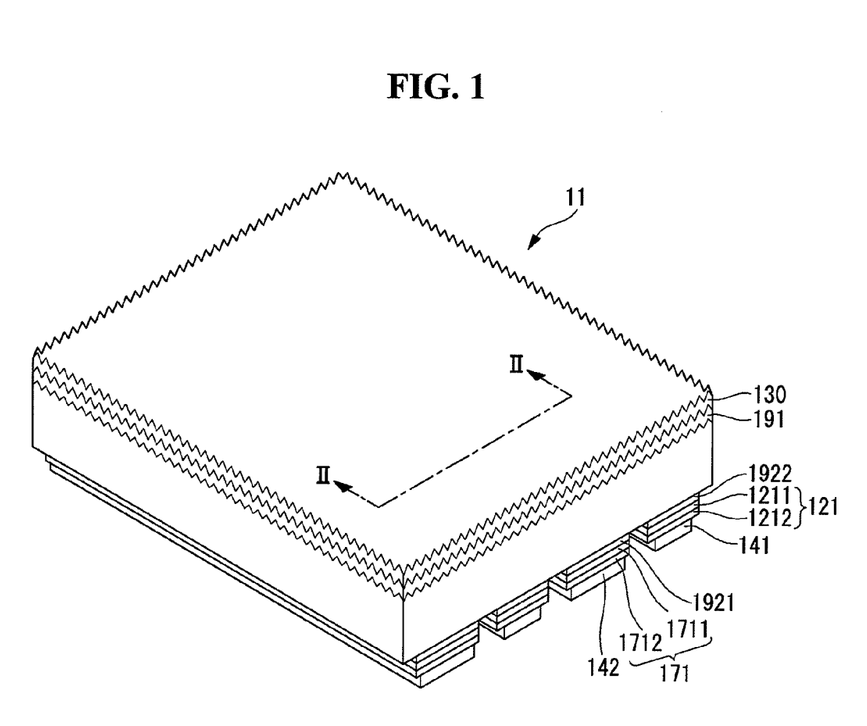
FIG. 1 is a partial perspective view of a solar cell according to an example embodiment of the invention.
Figure 2:
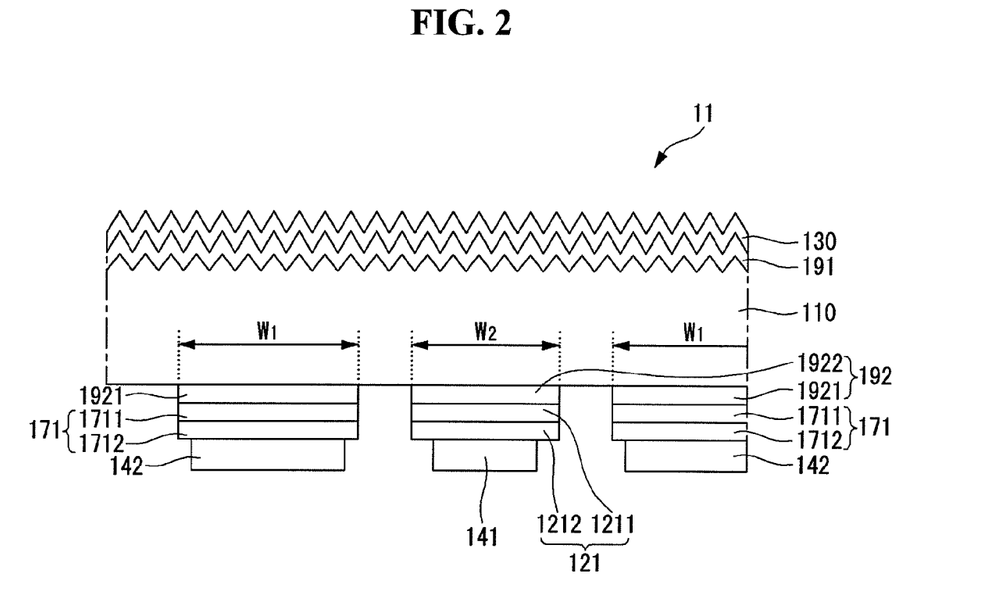
FIG. 2 is a cross-sectional view taken along line II-II of FIG. 1.

FIG. 1 is a partial perspective view of a solar cell according to an example embodiment of the invention and FIG. 2 is a cross-sectional view taken along line II-II of FIG. 1.

As shown in FIGS. 1 and 2, a solar cell 11 according to an example embodiment of the invention includes a substrate 110, a front buffer region 191 positioned on an incident surface (hereinafter, referred to as "a front surface") of the substrate 110 on which light is incident, an anti-reflection layer 130 positioned on the front buffer region 191, a back buffer region 192 positioned on a surface (hereinafter, referred to as "a back surface") of the substrate 110 opposite the front surface of the substrate 110, a plurality of emitter regions 121 positioned on the back buffer region 192, a plurality of back surface field (BSF) regions 171 positioned on the back buffer region 192 to be separated from the plurality of emitter regions 121, and a plurality of electrodes 141 respectively positioned on the plurality of emitter regions 121 and a plurality of electrodes 142 respectively positioned on the plurality of BSF regions 171.

In an example embodiment, light is generally incident on the front surface of the solar cell 11, but may be incident on the back surface of the solar cell 11 in other embodiments. An amount of light incident on the back surface is much less than that on the front surface of the solar cell 11.

The substrate 110 is a semiconductor substrate formed of, for example, first conductivity type silicon, for example, n-type silicon, though not required. Silicon used in the substrate 110 may be crystalline silicon such as single crystal silicon and polycrystalline silicon. Thereby, the substrate 110 is a crystalline semiconductor substrate.

When the substrate 110 is of an n-type, the substrate 110 is doped with impurities of a group V element such as phosphor (P), arsenic (As), and antimony (Sb). Alternatively, the substrate 110 may be of a p-type, and/or be formed of semiconductor materials other than silicon. When the substrate 110 is of the p-type, the substrate 110 is doped with impurities of a group III element such as boron (B), gallium (Ga), and indium (In).

The front surface of the substrate 110 may be textured to form a textured surface corresponding to an uneven surface or having uneven characteristics, by a texturing process. The texturing process is performed on a front substantially flat surface of the substrate 110. For convenience, FIG. 1 shows only an edge portion of the substrate 110 as having the textured surface and only edge portions of the front buffer region 191 and the anti-reflection layer 130 on the front surface of the substrate 110 as having the textured surface. However, the entire front surface of the substrate 110 actually has the textured surface, and thereby, the front buffer region 191 and the anti-reflection layer 130 on the front surface of the substrate 110 have the textured surface.

As shown in FIGS. 1 and 2, the back surface of the solar cell 11 has a flat surface instead of the textured surface. Thus, the elements positioned on the back surface of the solar cell 11 is stably and uniformly formed on the back surface to increase an adhesion of the elements on the back surface, and thereby, contact resistance between the substrate 110 and the elements is reduced. However, in an alternative example embodiment, like the front surface, the back surface of the solar cell 11 may have a textured surface.

The front buffer region 191 on the front surface of the substrate 110 may be made of non-crystalline semiconductor. For example, the front buffer region 191 may be made of hydrogenated intrinsic amorphous silicon (i-a-Si:H).

The front buffer region 191 may be positioned on the entire front surface of the substrate 110 or on the front surface of the substrate 110 except an edge portion of the front surface of the substrate 110.

Using hydrogen (H) contained in the front buffer region 191, the front buffer region 191 performs a buffer function that converts a defect, for example, dangling bonds existing on the surface of the substrate 110 and around the surface of the substrate 110 into stable bonds to thereby prevent or reduce a recombination and/or a disappearance of charges moving to the front surface of the substrate 110 resulting from the defect. Hence, the front buffer region 191 reduces a loss amount of charges caused by disappearance thereof by the defect on or around the surface of the substrate 110.

Due to charge loss etc., by the impurities of the n-type or p-type, which are contained (or doped) into the substrate 110, many defects exist at the substrate 110, in particular, on and/or around the surface of the substrate 110.

Thus, since the front buffer region 191 is directly positioned on the surface of the substrate 110, at which the defects exist, a loss amount of charges caused by disappearance thereof by the defects on or around the surface is reduced.

The front buffer region 191 has a thickness of about 1 nm to 10 nm.

When the thickness of the front buffer region 191 is equal to or greater than approximately 1 nm, a buffer function may be well performed because the front buffer region 191 is uniformly applied to the front surface of the substrate 110. When the thickness of the front buffer region 191 is equal to or less than approximately 10 nm, an amount of light absorbed in the front buffer region 191 is reduced. Hence, an amount of light incident on the substrate 110 may increase.

The anti-reflection layer 130 on the front buffer region 191 reduces a reflectance of light incident on the solar cell 11 and increases selectivity of a predetermined wavelength band of the incident light, thereby increasing an efficiency of the solar cell 11.

The anti-reflection layer 130 may be formed of hydrogenated silicon nitride (SiNx:H), hydrogenated amorphous silicon nitride (a-SiNx:H), or hydrogenated silicon oxide (SiOx:H), and may have a thickness of about 70 nm to 90 nm.

The anti-reflection layer 130 has a good transmittance of light when a thickness thereof is within a range of about 70 nm to 90 nm, to more increase an amount of light incident on the substrate. 110.

In this example embodiment, the anti-reflection layer 130 has a single-layered structure, but the anti-reflection layer 130 may have a multi-layered structure such as a double-layered structure in other embodiments. The anti-reflection layer 130 may be omitted, if desired. Like the front buffer region 191, the anti-reflection layer 130 also performs a passivation function.

Silicon nitride or silicon oxide has a characteristic of a fixed charge of a positive polarity (+), and thereby, when the anti-reflection layer 130 is made of silicon nitride or silicon oxide, the anti-reflection layer 130 has a positive (+) polarity.

Thus, when the substrate 110 is of an n-type, the fixed charge of the anti-reflection layer 130 is a positive polarity (+) which is the same as a polarity of minority carriers (i.e., holes) of the substrate 110. Thereby, the holes moving toward the front surface of the substrate 110 is thrust toward the back surface of the substrate 110, that is, the surface on which the emitter regions 121 outputting the holes are positioned, by the positive polarity (+) of the anti-reflection layer 130.

Thereby, since an amount of desired charges (i.e., holes) moving towards the front surface of the substrate 110 is decreased, the loss amount of holes caused by disappearance thereof at the front surface of the substrate 110 is reduced and an amount of holes moving to the emitter regions 121 is increased.

Thereby, by the passivation function of the front buffer region 191 and the anti-reflection layer 130 positioned on the front surface of the substrate 110, and the fixed charge of the anti-reflection layer 130, the loss amount of charges caused by disappearance thereof by the defect on or around the surface of the substrate 110 is reduced to improve the efficiency of the solar cell 11.

The back buffer region 192 directly positioned on the back surface of the substrate 110 includes a plurality of first back buffer portions 1921 and a plurality of second back buffer portions 1922. The first back buffer portions 1921 and the second back buffer portions 1922 are spaced apart from each other. The first and second back buffer portions 1921 and 1922 extend parallel to one another on the back surface of the substrate 110 in a predetermined direction, respectively. Thereby, each first back buffer portion 1921 and each second back buffer portion 1922 are alternately positioned on the back surface of the substrate 110.

The back buffer region 192 is made of amorphous silicon and performs the passivation function in the same manner as the front buffer region 191, thereby preventing or reducing a recombination and/or a disappearance of charges moving to the back surface of the substrate 110, due to the defects.

The first and second back buffer portions 1921 and 1922 of the back buffer region 192 have a thickness to an extent that charges moving to the back surface of the substrate 110 can pass through the first and second back buffer portions 1921 and 1922 and can move to the BSF regions 171 and the emitter regions 121, respectively. In this example embodiment, the thickness of each of the first and second back buffer portions 1921 and 1922 may be approximately 1 nm to 10 nm.

When the thickness of each of the first and second back buffer portions 1921 and 1922 is equal to or greater than approximately 1 nm, the passivation function may be further improved because the first and second back buffer portions 1921 and 1922 are uniformly applied to the back surface of the substrate 110. When the thickness of each of the first and second back buffer portions 1921 and 1922 is equal to or less than approximately 10 nm, an amount of light passing through the substrate 110 absorbed in the first and second back buffer portions 1921 and 1922 is reduced. Hence, an amount of light again incident inside the substrate 110 may further increase. The back buffer region 192 may be omitted if desired in embodiments of the invention.

Figure 3:
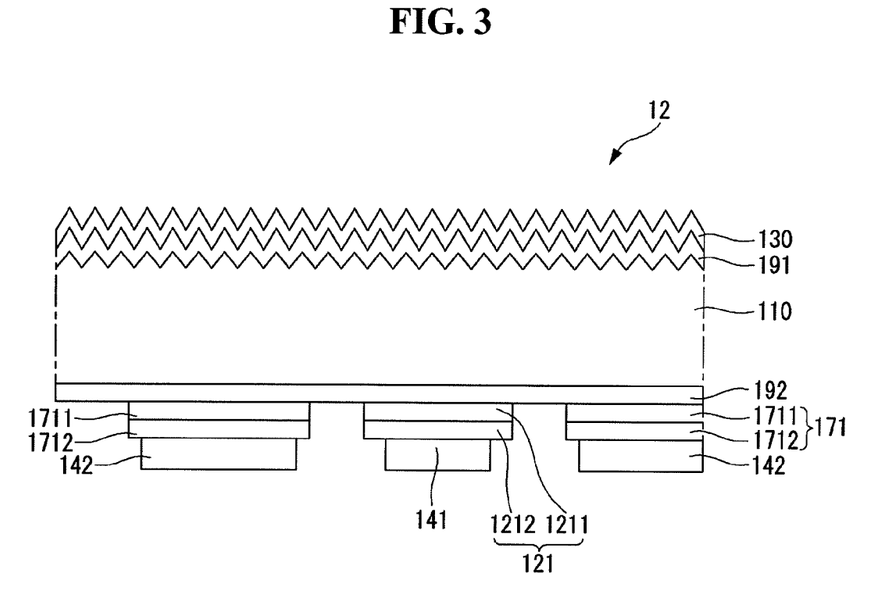
FIG. 3 is a partial perspective view of a solar cell according to another example embodiment of the invention.

As shown in FIG. 3, the back buffer region 192 is further directly positioned on portions of the back surface of the substrate 110 positioned between adjacent first and second back buffer portions 1921 and 1922. In this instance, since a formation area of the back buffer region 192 performing the back passivation function increases at the back surface of the substrate 110, the loss amount of charges caused by disappearance thereof at the back surface of the substrate 110 is further reduced. In addition, the substantially entire back surface of the substrate 110 is covered by the back buffer region 192, so that portions exposed to air at the back surface of the substrate 110 do not exist. Thereby, characteristic change of the substrate 110 caused by moisture or oxygen is prevented or reduced, to decrease a change in the characteristics of the solar cell 12.

In the example embodiment of the invention, such as shown in FIGS. 1 and 2, the plurality of BSF regions 171 are positioned on the first back buffer portions 1921 of the back buffer region 192 and each BSF region 171 is an impurity region that is more heavily doped with impurities of the same conductivity type as the substrate 110 than the substrate 110. For example, each BSF region 171 may be an n+-type region.

Each of the plurality of BSF regions 171 includes a first BSF portion 1711 positioned on the first back buffer portion 1921 and a second BSF portion 1712 positioned on the first BSF portion 1711.

Each first BSF portion 1711 extends along the first back buffer portion 1921. The plurality of first BSF portions 1711 are made of amorphous silicon (a-Si), and thereby are amorphous semiconductor portions of $n^+$-type. Accordingly, the BSF regions 171 also form the hetero junction with the substrate 110.

Each of the plurality of second BSF portion 1712 extends along the first BSF buffer portion 1711. In this instance, the first and second BSF portions 1711 and 1712 may have the same planar shapes as each other, and the first back buffer portions 1921 underlying the BSF regions 171 may have the same planar shape as the BSF regions 171.

The plurality of second BSF portions 1712 are made of crystalline silicon of the first conductivity type. For example, the plurality of second BSF portions 1712 are made of microcrystalline silicon or nanocrystalline silicon of an n+-type and thereby are crystalline semiconductor portions.

As shown in FIGS. 1 and 2, each of the first and second BSF portions 1711 and 1712 of the example embodiment is formed as a separated layer, or a double layer. However, the first and second BSF portions 1711 and 1712 may be formed in one layer. In this instance, the one layer includes an amorphous semiconductor portion as the first BSF portion 1711 and a crystalline semiconductor portion as the second BSF portion 1712.

The BSF regions 171 prevent or reduce the movement of charges (e.g., holes) toward the electrodes 142 through the plurality of first back buffer portions 1921 by a potential barrier resulting from a difference between impurity concentrations of the substrate 110 and the BSF regions 171. Further, the BSF regions 171 facilitate the movement of charges (for example, electrons) to the BSF regions 171. Thus, the BSF regions 171 reduce a loss amount of charges by a recombination and/or a disappearance of electrons and holes in or around the BSF regions 171 or in the electrodes 142 and accelerate the movement of electrons to the BSF regions 171, thereby increasing an amount of electrons moving to the BSF regions 171. Furthermore, the BSF regions 171 perform the passivation functions along with the underlying first back buffer portions 1921.

A thickness of each first BSF portion 1711 may be less than that of each second BSF portion 1712. For example, each first BSF portion 1711 may have a thickness of approximately 3 nm to 10 nm and each second BSF portion 1712 may have a thickness of approximately 6 nm to 25 nm. Thereby, the total thickness of each BSF region 171 may be approximately 10 nm to 35 nm.

When the total thickness of the BSF region 171 is equal to or greater than approximately 10 nm, the BSF region 171 may form a potential barrier sufficient to prevent or reduce the movement of holes to the BSF region 171 to thereby further reduce a loss amount of charges. When the thickness of the BSF region 171 is equal to or less than approximately 35 nm, the BSF region 171 further reduces an amount of light absorbed in the BSF region 171 to thereby further increase an amount of light again incident inside the substrate 110.

The plurality of emitter regions 121 are positioned on the second back buffer portions 1922 of the back buffer region 192 and extend along the second back buffer portions 1922.

As shown in FIGS. 1 and 2, each emitter region 121 and each BSF region 171 are alternately positioned on the back surface of the substrate 110.

Each emitter region 121 is of a second conductivity type (for example, a p-type) opposite a conductivity type of the substrate 110. Thus, the plurality of emitter regions 121 and the substrate 110 form a p-n junction.

Each emitter region 121 includes a first emitter portion 1211 positioned on the second back buffer portion 1922 and a second emitter portion 1212 positioned on the first emitter portion 1212. In this instance, the first and second emitter portions 1211 and 1212 may have the same planar shapes as each other, and the second back buffer portions 1922 underlying the emitter regions 121 may have the same planar shape as the emitter regions 121.

Each first emitter portion 1211 extends along the corresponding second back buffer portion 1922. The plurality of first emitter portions 1211 are made of amorphous silicon (a-Si), and thereby are amorphous semiconductor portions of a p-type. Thus, the plurality of emitter regions 1211 and the substrate 110 form a hetero junction as well as the p-n junction.

Each of the plurality of emitter portions 1212 extend along the corresponding first emitter portion 1211. In this instance, each of the plurality of second back buffer portions 1922 has the same planar shape as the first and second emitter portions 1211 and 1212 overlying the second back buffer portion 1922.

The plurality of second emitter portions 1212 are made of crystalline silicon of the second conductivity type. For example, the plurality of second emitter portions 1212 are made of microcrystalline silicon or nanocrystalline silicon of a p-type and thereby are crystalline semiconductor portions.

By a built-in potential difference resulting from the p-n junction between the substrate 110 and the emitter regions 121, electrons and holes produced by light incident on the substrate 110 move to the n-type semiconductor and the p-type semiconductor, respectively. Thus, when the substrate 110 is of the n-type and the emitter regions 121 are of the p-type, the electrodes move to the plurality of BSF regions 171 through the first back buffer portions 1921 of the back buffer region 192 and the holes move to the plurality of emitter regions 121 through the plurality of second back buffer portions 1922 of the back buffer region 192.

Further, by an energy band gap difference by the hetero junction between the substrate 110, and the BSF regions 171 and the emitter regions 121, that is, the energy band gap difference between crystalline silicon and non-crystalline silicon, the built-in potential difference increases. Thereby, an open circuit voltage (Voc) of the solar cell 11 is increased to improve fill factor of the solar cell 11.

Because the substrate 110 and each emitter region 121 form the p-n junction, the emitter regions 121 may be of the n-type when the substrate 110 is of the p-type unlike the example embodiment described above. In this instance, the electrons pass through the second back buffer portions 1922 of the back buffer region 192 and move to the emitter regions 121, and the holes pass through the first back buffer portions 1921 of the back buffer region 192 and move to the BSF regions 171.

When the plurality of emitter regions 121 are of the p-type, the emitter regions 121 may be doped with impurities of a group III element. On the contrary, when the emitter regions 121 are of the n-type, the emitter regions 121 may be doped with impurities of a group V element.

The plurality of emitter regions 121 may perform the passivation function along with the second back buffer portions 1922. In this instance, an amount of charges caused by disappearance thereof at the back surface of the substrate 110 by the defect is reduced, and thus the efficiency of the solar cell 11 is improved.

Like the BSF regions 171, each first emitter portion 1211 may have a thickness less than that of each second emitter portion 1212.

In the example, each first emitter portion 1211 may have a thickness of approximately 3 nm to 10 nm and each second emitter portion 1212 may have a thickness of approximately 2 nm to 25 nm. Thereby, each emitter region 121 may have the total thickness of approximately 5 nm to 35 nm.

When the thickness of the emitter region 121 is equal to or greater than approximately 5 nm, the emitter region 121 may form a good p-n junction with the substrate 110. When the thickness of the emitter region 121 is equal to or less than approximately 35 nm, an amount of light absorbed in the emitter region 121 is further reduced. Hence, an amount of light again incident inside the substrate 110 may further increase.

In general, a crystallization speed of n n-type semiconductor is greater than a crystallization speed of a p-type semiconductor. Thus, when the n-type semiconductor and the p-type semiconductor have the same crystallinity as each other, a crystallization time of the n-type semiconductor reaching the crystallinity is less than that of the p-type semiconductor and thereby, the thickness of the n-type semiconductor may be less than that of the p-type semiconductor.

In this example embodiment, the substrate 110 is of the n-type, the BSF regions 171 are of the n-type and the emitter regions 121 are of the p-type. Thus, when the second BSF portion 1712 and the second emitter portion 1212 are the same crystallinity, a thickness of each second BSF portion 1712 is less than that of the second emitter portion 1212, and thereby, the total thickness of each BSF region 171 is also less than that of each emitter region 121.

In this example embodiment, since the first emitter portions 1211 and the first BSF portions 1711 of an amorphous semiconductor (i.e., amorphous silicon) on the back buffer region 192 of an intrinsic semiconductor (i.e., intrinsic amorphous silicon), a crystallization phenomenon obtained when the first emitter portions 1211 of the emitter regions 121 and the first BSF portions 1711 of the BSF regions 171 are positioned on the first and second back buffer portions 1921 and 1922, respectively, is reduced further than a crystallization phenomenon obtained when the first emitter portions 1211 and the first BSF portions 1711 are positioned directly on the substrate 110 of a crystalline semiconductor.

When an amorphous semiconductor is formed directly on the substrate 110 of a crystalline semiconductor, the first emitter portions 1211 and the first BSF portions 1711 of amorphous silicon is crystallized under the influence of the crystallinity of the substrate 110. In this instance because at least one portion of the first emitter portions 1211 and at least one portion of the first BSF portions 1711 are crystallized, the effect of the hetero junction between the substrate 110 and the emitter region 121 and the BSF regions 171 is reduced or eliminated. However, in this example embodiment, since the back buffer region 192 of an intrinsic amorphous semiconductor which does not have a crystal positioned between the substrate 110 of a crystalline semiconductor and the first emitter portions 1211 and the first BSF portions 1711 of a non-crystalline semiconductor, the influence of the substrate 110 on the first emitter portions 1211 and the first BSF portions 1711 is blocked by the back buffer region 192 and thereby the crystallization phenomenon of the first emitter portions 1211 and the first BSF portions 1711 does not occur. Therefore, the first emitter portions 1211 and the first BSF portions 1711 stably remain as non-crystalline semiconductors, to thereby form the hetero junction with the substrate 110.

In this example embodiment, a width (W1) of the BSF region 171 is different from a width (W2) of the emitter region 121. For example, the width (W1) of the BSF region 171 is greater than the width (W2) of the emitter region 121. In this instance, a width of the first back buffer portion 1921 underlying the BSF region 171 is greater than a width of the second back buffer region 1922 underlying the emitter region 121. Thereby, a surface size of the substrate 110 which is covered with the second BSF regions 171 increases to more improve the back surface field effect obtained by the BSF regions 171.

However, in an alternative embodiment, the width (W2) of the emitter region 121 is greater than the width (W1) of the second BSF region 171. In this instance, since an area of the p-n junction increases, an amount of the electrons and holes generated in the area of the p-n junction increases, and the collection of holes having mobility less than that of electrons is facilitated.

The plurality of electrodes 141 on the second emitter portions 1212 of the plurality of emitter regions 121 extend along the second emitter portions 1212 and are electrically and physically connected to the second emitter portions 1212. Each electrode 141 collects charges (for example, holes) moving to the corresponding emitter region 121.

The plurality of electrodes 142 on the second BSF portions 1712 of the plurality of BSF regions 171 extend along the second BSF regions 1712 and are electrically and physically connected to the second BSF portions 1712. Each electrode 142 collects charges (for example, electrons) moving to the corresponding BSF region 171.

In FIGS. 1 and 2, the electrodes 141 and 142 have the different planar shapes or sheet shapes from the emitter regions 121 and the BSF regions 171 underlying the electrodes 141 and 142. However, they may have the same planar shapes as the emitter regions 121 and the BSF regions 171. As a contact area between the emitter regions 121 and the BSF regions 171 and the respective electrodes 141 and 142 increases, a contact resistance therebetween decreases. Hence, a charge transfer efficiency of the electrodes 141 and 142 increases.

The plurality of electrodes 141 and 142 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used. As described above, because the plurality of electrodes 141 and 142 are formed of the metal material, the plurality of electrodes 141 and 142 reflect light passing through the substrate 110 onto the substrate 110.

Since the second emitter portion 1212 and the second BF portions 1712, each which is made of crystalline silicon having a larger conductivity than amorphous silicon that are positioned between the first emitter portion 1211 of amorphous silicon and the electrode 141, and between the first BSF portion 1711 of amorphous silicon and electrode 142, respectively, contact power between the electrodes 141 and 142 and the emitter region and the BSF region 171 improves, and conductivity from the emitter region 121 and the BSF region 171 to the electrodes 141 and 142 also increases. Thereby, a serial resistance of the solar cell 11 decreases and a fill factor of the solar cell 11 increases, to improve the efficiency of the solar cell 11. In addition, the charge transfer efficiency from the emitter regions 121 and the BSF regions 171 to the electrodes 141 and 142 increases to further improve the efficiency of the solar cell 11.

The solar cell 11 having the above-described structure is a solar cell in which the plurality of electrodes 141 and 142 are positioned on the back surface of the substrate 110, on which light is not incident, and the substrate 110 and the plurality of first emitter portions 1211 are formed of different kinds and/or characteristic semiconductors. An operation of the solar cell 11 is described below.

When light is irradiated onto the solar cell 11 and sequentially passes through the anti-reflection layer 130 and the front buffer region 191 to be incident on the substrate 110, a plurality of electron-holes pairs are generated in the substrate 110 by light energy based on the incident light. In this instance, because the front surface of the substrate 110 is the textured surface, a reflectance of light at the front surface of the substrate 110 is reduced. Further, because both a light incident operation and a light reflection operation are performed by the textured surface of the substrate 110, absorption of light increases and the efficiency of the solar cell 11 is improved. In addition, because a reflection loss of the light incident on the substrate 110 is reduced by the anti-reflection layer 130, an amount of light incident on the substrate 110 further increases.

By the p-n junction of the substrate 110 and the first emitter portions 1211, the holes move to the p-type emitter regions 121 and the electrons move to the n-type second BSF regions 171. The holes moving to the p-type emitter regions 121 are collected by the electrodes 141, and the electrons moving to the n-type BSF regions 171 are collected by the electrodes 142. When the electrodes 141 and the electrodes 142 are connected to each other using electric wires, current flows therein to thereby enable use of the current for electric power.

Further, because the buffer regions 192 and 191 are positioned on the front surface as well as the back surface of the substrate 110, the loss amount of charges caused by disappearance thereof by the defect on and around the front and back surfaces of the substrate 110 is reduced. Hence, the efficiency of the solar cell 11 is improved.

In addition, since the BSF regions 171 heavily doped with impurities of the same conductivity type as the substrate 110 are positioned on the back surface of the substrate 110, the movement of holes to the back surface of the substrate 110 is prevented or reduced. Thus, the recombination and/or the disappearance of charges at the back surface of the substrate 110 are prevented or reduced, to improve the efficiency of the solar cell 11.

By the second emitter portions 1212 and the second BSF portions 1712, which are made of crystalline silicon having a larger conductivity than amorphous silicon, the serial resistance is reduced and the fill factor is increased. Thereby, the charge transfer efficiency to the electrodes 141 and 142 increase to improve the efficiency of the solar cell 11. Accordingly, an intrinsic semiconductor, such intrinsic amorphous silicon, in the form of the plurality of first back passivation portions 1921 and the plurality of second back passivation portions 1922, are disposed between the crystalline silicon substrate 110 and the crystalline silicon second emitter portions 1212 and the crystalline silicon second BSF portions 1712.

Next, with reference to FIGS. 4 to 12, a solar cell according to another example embodiment of the invention is described.

As compared with FIGS. 1 to 3, elements performing the same operations are indicated with the same reference numerals, and the detailed description thereof is omitted.

Figure 4:
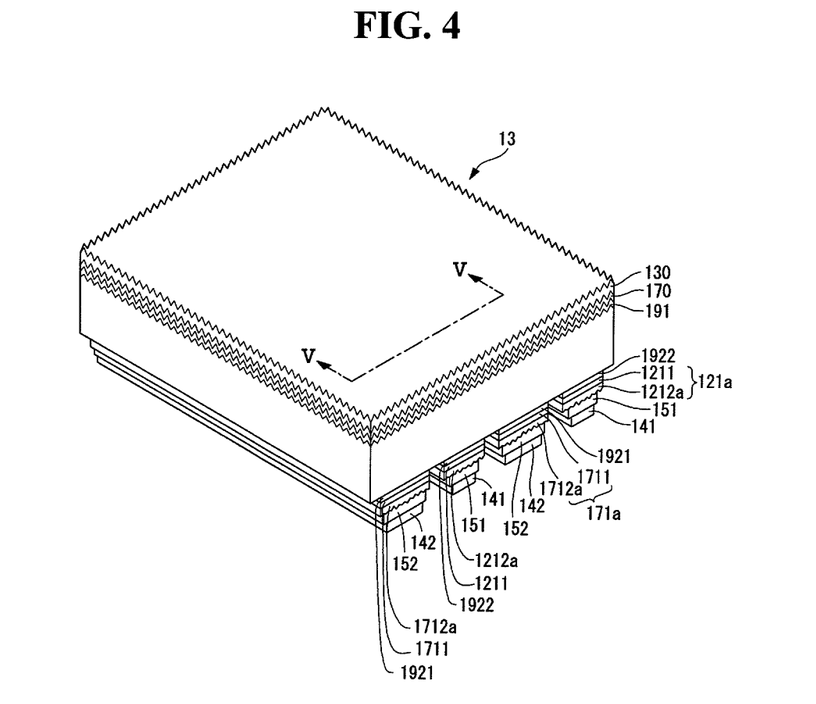
FIG. 4 is a partial perspective view of a solar cell according to yet another example embodiment of the invention.
Figure 5:
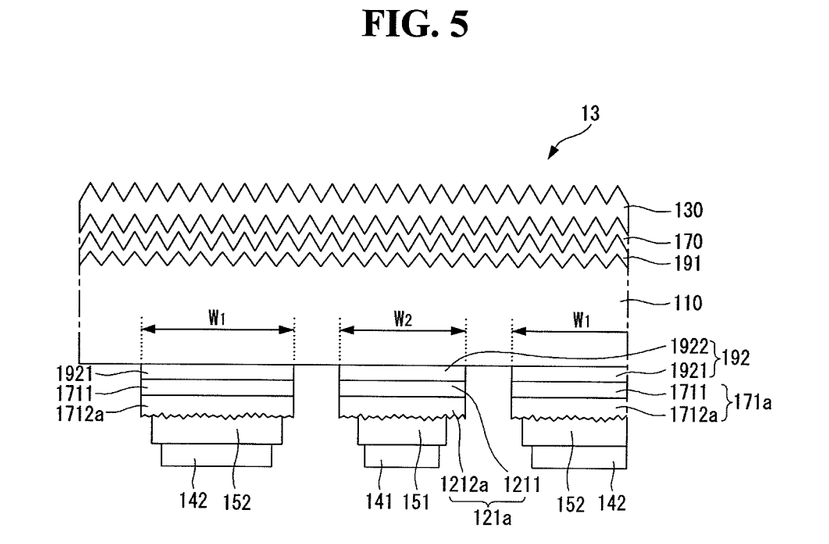
FIG. 5 is a cross-sectional view taken along line V-V of FIG. 4.

Like the solar cells 11 and 12 of FIGS. 1 to 3, a solar cell 13 shown in FIGS. 4 and 5 forms a hetero junction, and all the electrodes outputting charges are positioned on a back surface.

Thereby, in the solar cell 13 shown in FIGS. 4 and 5, a front buffer region 191 and an anti-reflection layer 130, which are made of a non-crystalline semiconductor are positioned on a front surface of a substrate 110 of a crystalline semiconductor, and a back buffer region 192 made of a non-crystalline semiconductor and having first and second back buffer portions 1921 and 1922, a plurality of emitter regions 121a and a plurality of BSF regions 171a on the back buffer region 192, and the electrodes 141 and 142 on the emitter regions 121a and the BSF regions 171a, are positioned on the back surface of the substrate 110.

However, unlike the solar cells 11 and 12 of FIGS. 1 to 3, the solar cell 13 further includes a front surface field (FSF) region 170 between the front buffer region 191 and the anti-reflection layer 130.

The FSF region 170 is made of amorphous silicon, and is an impurity region that is more heavily doped than the substrate 110 with impurities of the same conductivity type (e.g., an n-type) as the substrate 110. Thus, the FSF region 170 also forms the hetero junction with the substrate 110.

When the FSF region 170 is of the n-type, the FSF region 170 is doped with impurities of a group V element.

The FSF region 171, similar to the BSF regions 171a, prevent or reduce the movement of desired charges (e.g., holes) to the front surface of the substrate 110 by a potential barrier resulting from a difference between impurity concentrations of the substrate 110 and the FSF region 170, such that a front surface field function is performed at the front surface of the substrate 110. Thus, a front surface field effect by the FSF region 170 is obtained, so that the holes moving to the front surface of the substrate 110 are turned back to the back surface of the substrate 110 by the potential barrier. Hence, a loss amount of charges by a recombination and/or a disappearance of the electrons and the holes at and around the front surface of the substrate 110 is reduced.

In addition, by the hetero junction of the substrate 110 and the FSF region 170, an open circuit voltage (Voc) of the solar cell 13 increases.

The FSF region 170 along with the front buffer region 191 performs a passivation function as well as the front surface field function. That is, as the front buffer region 191, the FSF region 170 performs the passivation function using hydrogen (H) contained in the FSF portion 170. Thereby, the FSF region 170 stably compensates the passivation function of the front buffer region 191 having a thin thickness, so that the passivation effect on the front surface of the substrate 110 is stably and reliably obtained.

The solar cell 13 further includes a plurality of auxiliary electrodes 151 positioned between the plurality of emitter regions 121a and the plurality of electrodes 141, and a plurality of auxiliary electrodes 152 positioned between the plurality of BSF regions 171a and the plurality of electrodes 142. The auxiliary electrodes 151 and 152 may be made of a transparent conductive material.

Like each emitter region 121 of FIGS. 1 to 3, each emitter region 121a includes a first emitter portion 1211 contacting with the second back buffer portion 1922 and made of amorphous silicon (a-Si) of a second conductivity type, and a second emitter portion 1212a positioned on the first emitter portion 1211 and made of a crystalline semiconductor of the second conductivity type such as microcrystalline silicon or nanocrystalline silicon.

Similar to each BSF region 171 of FIGS. 1 to 3, each BSF region 171a includes a first BSF portion 1711 contacting with the first back buffer portion 1921 and made of amorphous silicon (a-Si) of a first conductivity type, and a second BSF portion 1712a positioned on the first BSF portion 1711 and made of a crystalline semiconductor of the first conductivity type such as microcrystalline silicon or nanocrystalline silicon.

Each second BSF portion 1712a and each second emitter portion 1212a have different thicknesses from each other. Thereby, each second BSF portion 1712a has a thickness of approximately 8 nm to 60 nm.

Thereby, as described with reference to FIGS. 1 and 2, crystallization phenomenon of the first emitter portions 1211 and the first BSF portions 1711 is reduced and/or prevented, to improve the characteristics of the first emitter portions 1211 and the first BSF portions 1711.

In addition, since the conductivity of the second emitter portions 1212a and the second BSF portions 1712a, which are made of crystalline semiconductor increases and an ohmic contact is formed, conductivity and adhesiveness between the auxiliary electrodes 151 and 152, and the emitter regions 121a and the BSF regions 171a, respectively, are improved. Thereby, an amount of charges moving from the second emitter portions 1212a and the second BSF portions 1712a to the electrodes, for example, the auxiliary electrodes 151 and 152, positioned thereon increases for a unit time.

Thus, serial resistance of the solar cell 11 is reduced to improve a fill factor of the solar cell 11, and the thereby an efficiency of the solar cell 11 increases. Further, the charge transfer efficiencies between the emitter regions 121 and the BSF regions 171 with the auxiliary electrodes 151 and 152 is improved, to further increase the efficiency of the solar cell 11.

However, unlike the solar cells 11 and 12 of FIGS. 1 to 3, in the solar cell 13, surfaces of the second emitter regions 1212a and the second BSF regions 1712a contacting with the auxiliary electrodes 151 and 152 are not flat surfaces but uneven surfaces.

Figure 6:
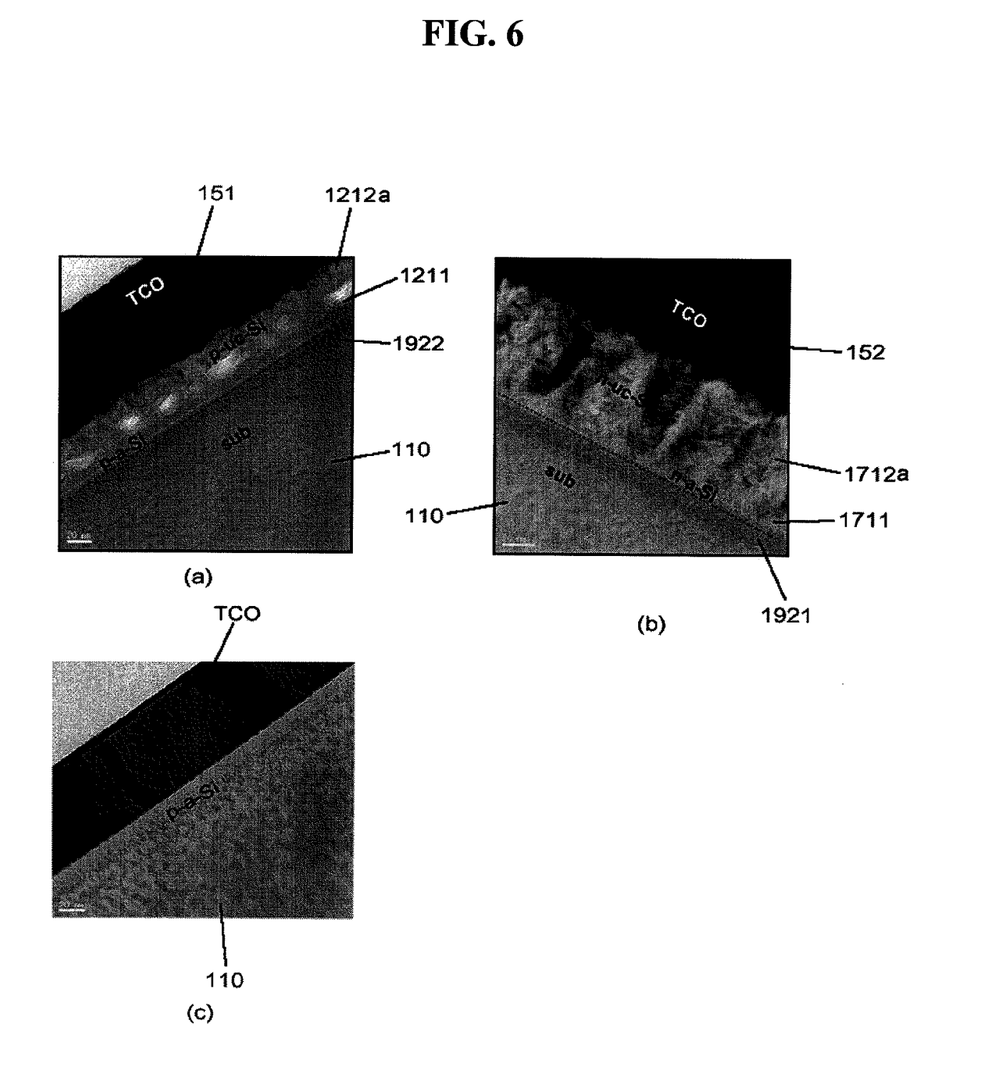

That is, as shown in (A) and (B) of FIG. 6, surface shapes of each second emitter portion 1212a and the second BSF portion 1712a contacting with the auxiliary electrodes 151 and 152 are uneven and have a plurality of protrusions. In this instance, the plurality of protrusions have irregular magnitudes.

(A) of FIG. 6 is a view showing a portion of a second emitter portion (p-μc-Si) 1212a of a p-type on a substrate (sub) 110, and a portion of an auxiliary electrode 151 thereon according to an example embodiment of the invention, and (B) of FIG. 6 is a view showing a portion of a second BSF portion (n-μc-Si) 1712a of an n-type and a portion of an auxiliary electrode 152 thereon according to an example embodiment of the invention. Further, (C) of FIG. 6 is a view showing a portion of amorphous silicon (p-a-Si) and a portion of an auxiliary electrode (TCO) thereon when the amorphous silicon is formed on a substrate for an emitter region or an BSF region according to a comparative example.

Unlike (A) and (B) of FIG. 6, in (C) of FIG. 6, a surface, that is, a surface contacting with the auxiliary electrode, of the emitter region or the BSF region that is made of amorphous silicon is substantially flat.

As shown in (A) and (B) of FIG. 6, the second emitter portions 1212a and the second BSF portions 1712a grows as crystals in a column shape on the first emitter portions 1211 and the first BSF portions 1711, and thereby, grain boundaries occur between the crystals having different orientations from each other.

In the example embodiment, surface roughness (RMS, root mean square) of each second emitter portions 1212a and each second BSF portions 1712a is approximately 1.5 nm to 10 nm, and crystallinity of each second emitter portions 1212a and each second BSF portions 1712a, that is, crystallinity in a thickness of each second emitter portions 1212a and each second BSF portions 1712a, is approximately 10 vol % to 90 vol %.

In the example embodiment, the surface roughness is measured using a measured length (or measured area) L and heights (i.e., heights from a valley to a peak of each protrusion) Z1, Z2, . . . Zx of each protrusion existing within the measured length L, and the surface roughness Rq may be calculated by [Equation 1]

$$R_q = \sqrt{\frac{1}{L}\int_0^L z^2(x)dx}$$ [Equation 1]

In addition, a value (peak to valley) [Rt(PV)] (hereinafter, the value is referred to as 'the maximum height of protrusions') subtracting a bottom point of the valleys of the protrusions from a top point of the peaks of the protrusions is approximately 15 nm to 40 nm.

Figure 12:
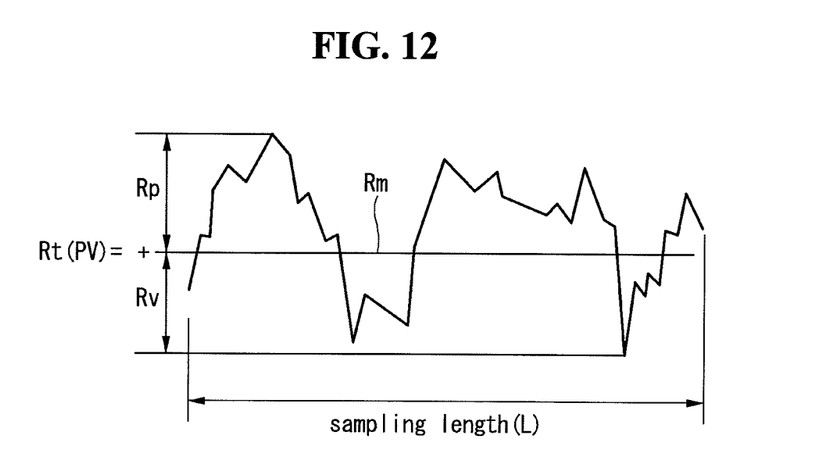
FIG. 12 is a diagram showing a definition of a maximum height of a plurality of protrusions according to an example embodiment of the invention.

FIG. 12 shows the maximum height [Rt(PV)] calculated in a plurality of protrusions as an example. That is, as shown in FIG. 12, the maximum height [Rt(PV)] is calculated by adding a distance Rp from a middle height Rm of the protrusions in a sampling length to the top point, and a distance Rv from the middle height Rm to the bottom point.

The back buffer region 192, the emitter regions 121a and the back BSF regions 171a on the back buffer region 192 may be formed by a deposition method such as a plasma enhanced vapor deposition (PECVD) method, and the uneven surfaces of the second emitter portions 1212a and the second BSF portions 1712a may be formed during crystallizing of the second emitter portions 1212a and the second BSF portions 1712a.

Thereby, the second emitter portions 1212a and the second BSF portions 1712a are formed on the first emitter portions 1211 and the first BSF portions 1711a by using the PECVD method, etc., and the process gases for the PECVD method, etc., may be $SiH_4$, $H_2$, a doping gas such as $PH_3$ or $B_2H_6$ containing a group III element or a group VI element for an n-type or a p-type and so on. The crystallinity, the thickness and/or the surface roughness of the second emitter portions 1212a and the second BSF portions 1712a are controlled by a process time (i.e., a deposition time) or a mixture ratio of the process gases, etc.

Figure 7:
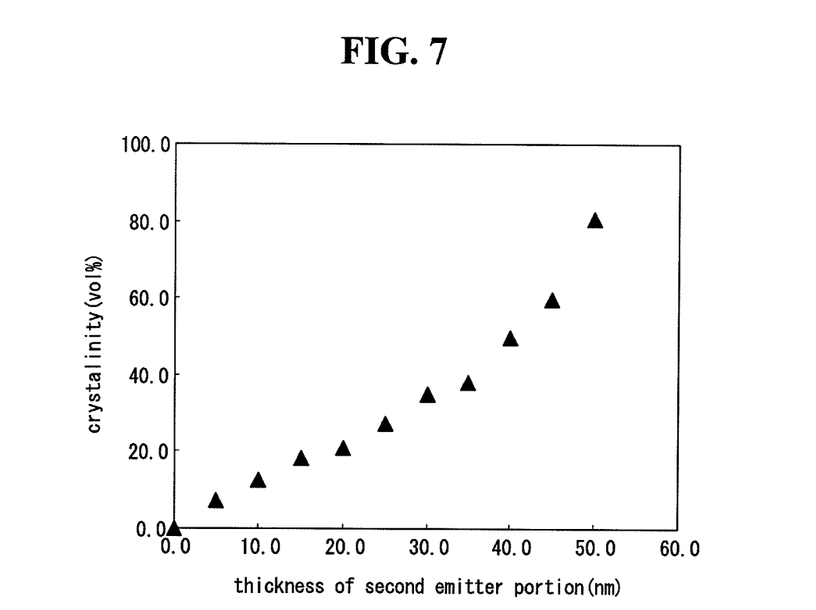
FIG. 7 is a graph showing crystallinity of a crystalline silicon region of a p-type in accordance with a thickness variation of the crystalline silicon region according to an example embodiment of the invention.
Figure 8:
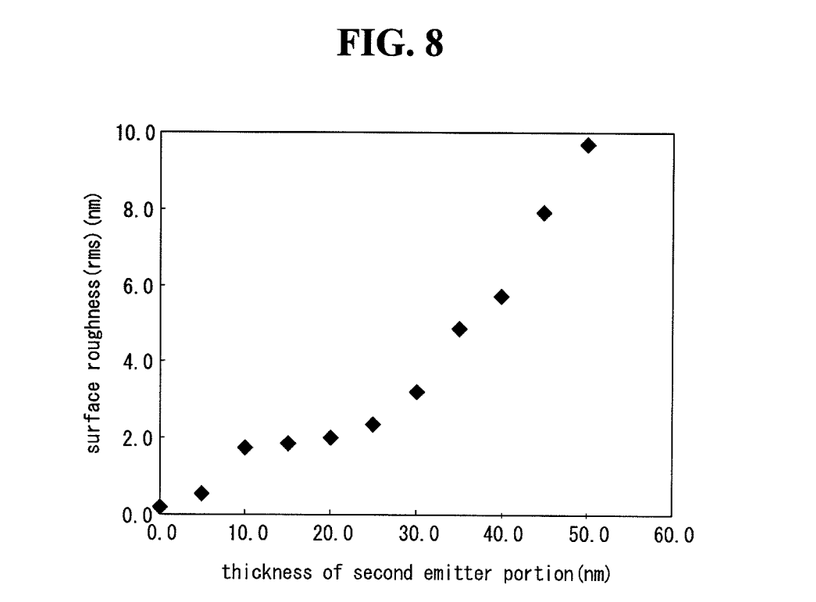
FIG. 8 is a graph showing surface roughness of a crystalline silicon region of a p-type in accordance with a thickness variation of the crystalline silicon region according to an example embodiment of the invention.
Figure 9:
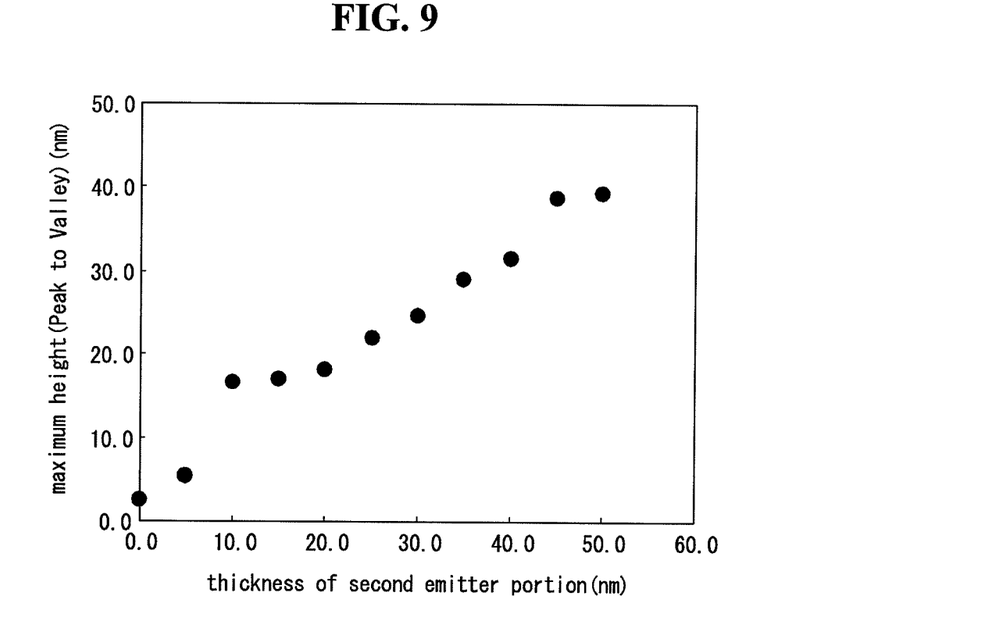
FIG. 9 is a graph showing a maximum height of a plurality of protrusions in accordance with a thickness variation of the crystalline silicon region according to an example embodiment of the invention.

As shown in FIG. 7, as the thickness of the second emitter portion 1212a increases, the crystallinity of the second emitter portion 1212a increases, and as shown in FIGS. 8 and 9, as the thickness of the second emitter portion 1212a increases, the surface roughness of the second emitter portion 1212a and the maximum height of the protrusions increase.

Referring to graphs of FIGS. 8 and 9, as the thickness of the second emitter portion 1212a increases, a variation of the maximum height of the protrusions is larger than a variation of the surface roughness of the second emitter portion 1212a.

In FIGS. 7 to 9, the crystallinity and surface roughness of the second emitter portion 1212a, and the maximum height of the protrusions in the uneven surface are shown in accordance with a thickness variation of the second emitter portions 1212a, but, in the second BSF portion 1712a of a conductivity type different from that of the second emitter portion 1212a, a similar result to that of FIGS. 7 to 9 is obtained. Thereby, graphs about the crystallinity, the surface roughness and the maximum height in the second BSF portion 1712a are omitted.

As the surface roughness of the second emitter portions 1212a and the second BSF portions 1712a contacting with the auxiliary electrodes 151 and 152 increases, a surface area of the second emitter portions 1212a and the second BSF portions 1712a, that is, a cross-sectional area of the surface contacting with the auxiliary electrodes 151 and 152 increases to thereby increase a contact area with the auxiliary electrodes 151 and 152. Further, since the surfaces of the second emitter portions 1212a and the second BSF portions 1712a are rough, a bonding strength becomes increased.

In the example embodiment, when the crystallinity of the second emitter portions 1212a and the second BSF portions 1712a is in a range (or predetermined range), the second emitter portions 1212a and the second BSF portions 1712a have the stable surface roughness, maximum height and conductivity without waste of processing time.

In addition, when the surface roughness and maximum height of the second emitter portions 1212a and the second BSF portions 1712a is in the range, the second emitter portions 1212a and the second BSF portions 1712a stably obtain the contact area and the bonding strength.

The plurality of auxiliary electrodes 151 on the plurality of emitter regions 121a and the plurality of second auxiliary electrodes 152 on the plurality of BSF regions 171a extend along each emitter region 121a and each BSF region 171a, respectively, and as described above, are made of the conductive transparent material such as transparent conductive oxide (TCO). Thereby, the plurality of auxiliary electrodes 151 are electrically and physically connected to the plurality of emitter regions 121a, and the plurality of auxiliary electrodes 151 are electrically and physically connected to the plurality of BSF regions 171a.

The auxiliary electrodes 151 and 152 protect the emitter regions 121a and the BSF regions 171a from oxygen in the air, thereby preventing changes of characteristics of the emitter regions 121a and the BSF regions 171a resulting from an oxidation reaction.

Examples of the transparent conductive material for the auxiliary electrodes 151 and 152 include ITO, ZnO, SnO$_2$, TCO, etc., or a combination thereof, or a material obtained by doping these materials or the combination with aluminum (Al), germanium (Ge), gallium (Ga), and/or ferrum (i.e., iron) (Fe), etc.

The plurality of auxiliary electrodes 151 and 152 respectively transfer carriers, for example, holes and electrons respectively moving to the emitter regions 121a and the BSF regions 171a, and reflects light passing through the substrate 110 and the back buffer region 192 to the substrate 110, thereby serving as a reflector increasing an amount of light incident on the substrate 110.

As described above, by the protrusions at the surfaces of the second emitter regions 1212a and the second BSF regions 1712a, which are in contact with the auxiliary electrodes 151 and 152, respectively, the contact area and the bonding strength of the auxiliary electrodes 151 and 152 and the second emitter regions 121a and the second BSF regions 171a increase.

Thereby, an amount of carriers (charges) moving from the second emitter regions 121a and the second BSF regions 1712a to the auxiliary electrodes 151 and 152 increases.

In addition, since the bonding strength between the second emitter and BSF regions 1212a and 1712a and the auxiliary electrodes 151 and 152 increase by the uneven surfaces of the second emitter and BSF regions 121a and 171a, the exfoliation of the auxiliary electrodes 151 and 152 from the substrate 110 is largely decreased.

In the example embodiment, the plurality of auxiliary electrodes 151 and 152 formed of the transparent conductive material exist between the plurality of emitter regions 121 and the plurality of BSF regions 171 formed of a semiconductor material such as amorphous silicon and the plurality of electrodes 141 and 142 formed of a metal material, thereby improving an adhesive strength between the semiconductor material with a low adhesive strength (adhesive characteristic) and the metal material. Hence, an adhesive strength between the emitter regions 121 and the electrodes 141, and an adhesive strength between the BSF regions 171 and the electrodes 142 are improved.

Further, an ohmic contact is formed between the emitter regions 121 and the electrodes 141, and between the BSF regions 171 and the electrodes 142, thereby improving the conductivity between the emitter regions 121 and the electrodes 141, and the conductivity between the BSF regions 171 and the electrodes 142. Hence, the transfer efficiency carriers moving from the emitter regions 121 and the BSF regions 171 to the electrodes 141 and 142 increases.

In an alternative example embodiment, the plurality of auxiliary electrodes 151 and 152 may be omitted. In this instance, the electrodes 141 and 142 are directly positioned on the second emitter portions 1212a of the emitter regions 121a and the BSF portions 1712a of the BSF regions 171a, respectively, and are in contact with the second emitter and BSF portions 1212a and 1712a. Further, since the second emitter portions 1212a and the second BSF portions 1712a are made of crystalline silicon, which has a larger conductivity than amorphous silicon, the conductivity of the second emitter portions 1212a and the second BSF portions 1712a increases, and since the surfaces of the second emitter portions 1212a and the second BSF portions 1712a have the plurality of protrusions, a contact area and a bonding strength between the second emitter portions 1212a and the second BSF portions 1712a and the electrodes 141 and 142 increase. Thus, charges are stably transferred from the second emitter portions 1212a and the second BSF portions 1712a to the electrodes 141 and 142, and an exfoliation between the substrate 110 and the electrodes 141 and 142 is reduced.

Therefore, by the increment of the conductivity, the bonding strength, and the contact area of the second emitter portions 1212a and the second BSF portions 1712a, current (for example, a short circuit current) of the solar cell 11 increase.

Figure 10:
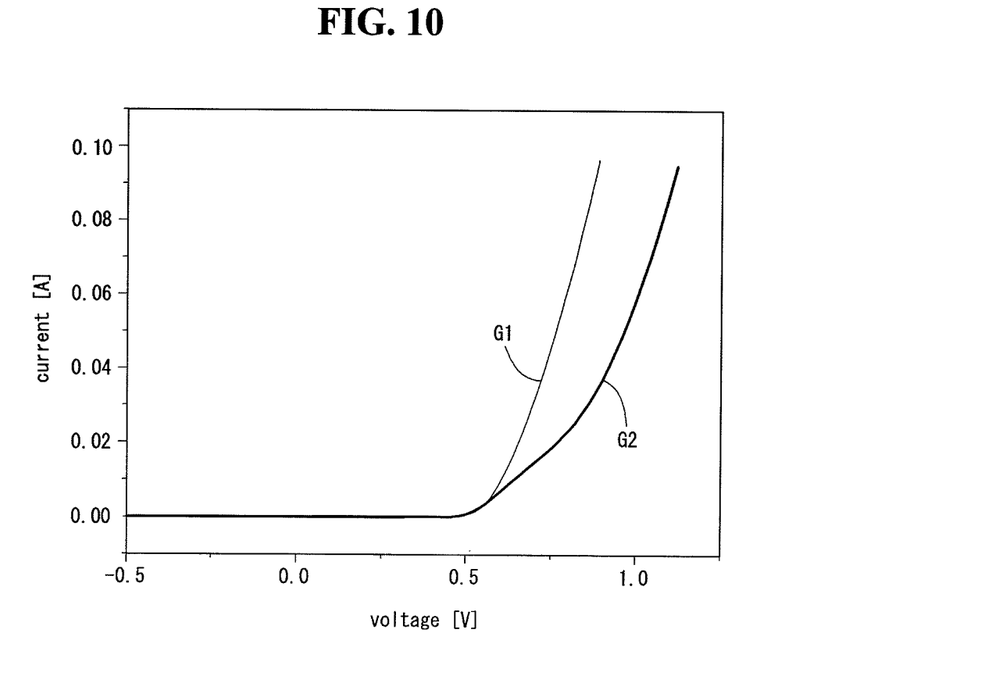
FIG. 10 is a graph showing currents in accordance with a voltage variation according to an example embodiment of the invention and a comparative example, respectively.

That is, with reference to FIG. 10, when the same voltage (for example, an open circuit voltage) is outputted in the solar cells according to an example embodiment of the invention and a comparative example, current obtained in the solar cells is different from each other.

In FIG. 10, a graph 'G1' shows current obtained in a solar cell having the second emitter portions 1212a and the second BSF portions 1712a of a crystalline semiconductor according to an example embodiment of the invention, and a graph 'G2' shows current obtained in a solar cell having an emitter region and an BSF region of only amorphous silicon and without the crystallized second emitter region 1212a and the crystallized second BSF regions 1712a according a comparative example.

In FIG. 10, when the solar cells of the invention and the comparative example output the equal voltages, the current of an example embodiment of the invention is much larger than that of the comparative example. Thereby, it is understood that an efficiency of the solar cell according to an example embodiment of the invention is greater than that of the solar cell according to the comparative example.

Figure 11:
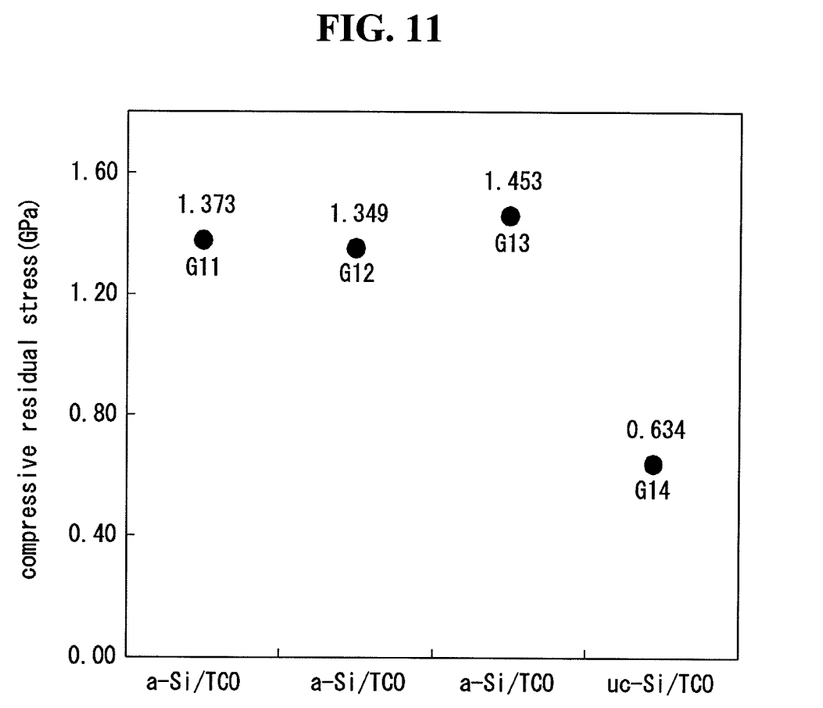
FIG. 11 is a graph showing compressive residual stresses measured in solar cells according to an example embodiment of the invention and a comparative example, respectively.

As shown in FIG. 11, compressive residual stress of the auxiliary electrodes 151 and 152 is largely reduced by the crystallized second emitter region 1212a and the crystallized second BSF regions 1712a, and thereby breaks such as cracks occurring in the auxiliary electrodes 151 and 152 are decreased.

That is, the auxiliary electrodes 151 and 152 are compressed in left and right directions (i.e., a direction parallel to the back surface of the substrate 110), and thereby have stress extending to the left and right directions. However, each second emitter region 1212a and each second BSF region 1712a have crystallized growth portions in a column shape and thereby have many grain boundaries, and the surfaces of the second emitter regions 1212a and second BSF regions 1712a are uneven surfaces with a predetermined surface roughness, as described above.

Thus, under the influenced of the surface roughness and the grain boundaries, etc., of the second emitter and BSF regions 1212a and 1712a, when the auxiliary electrodes 151 and 152 are positioned on the crystallized and uneven second emitter and BSF portions 1212a and 1712a, distances between the grain boundaries of the auxiliary electrodes 151 and 152 are less than those between the grain boundaries of the auxiliary electrodes 151 and 152 when the auxiliary electrodes 151 and 152 are positioned on the non-crystallized emitter and BSF regions [with reference to (A) to (C) of FIG. 6].

The compressive residual stress is distributed along the grain boundaries at positions on which the grain boundaries of the auxiliary electrodes 151 and 152 are positioned, to decrease the compressive residual stress. In this example embodiment, since the distances of adjacent grain boundaries become less, the distribution number of the compressive residual stress increases and thereby the compressive residual stress of the auxiliary electrodes 151 and 152 further decreases. Therefore, the compressive residual stress of the auxiliary electrodes 151 and 152 largely decreases, and the breaks of the auxiliary electrodes 151 and 152 are also reduced.

Accordingly, as shown in FIG. 11, a magnitude G14 of the compressive residual stress measured in the solar cell of an example embodiment of the invention is far less than magnitudes G11-G13 in the solar cell of the comparative example.

In FIG. 11, after an amorphous silicon layer a-Si and a transparent conductive oxide layer TCO are formed on a substrate of single crystal silicon, each of the compressive residual stress G11-G13 of the comparative example is measured in a transparent conductive oxide layer TCO, and after a crystalline silicon layer μc-Si and a transparent conductive oxide layer TCO are formed on an n-type substrate of single crystal silicon, the compressive residual stress G14 of the invention is measured in the transparent conductive oxide layer TCO. The substrate of the example embodiment of the invention and the comparative example has a thickness of approximately 180 nm, the amorphous silicon layer has a thickness of approximately 19 nm and the crystalline silicon layer has a thickness of approximately 20 nm. The transparent conductive oxide layer has a thickness of approximately 80 nm.

In the example embodiment, since the solar cell 13 further includes the FSF region 170 as well as the BFS regions 171a, the front surface field function and the back surface field function are performed by the FSF region 170 and the BSF regions 171a, to thereby decrease or prevent recombination of electrons and holes, and to improve the efficiency of the solar cell 13.

In addition, since the surfaces of the second emitter and BSF regions 1212a and 1712a of the crystalline silicon, which are in contact with the auxiliary electrodes 151 and 152 [or the electrodes 141 and 142] have the uneven surfaces, the serial resistance of the solar cell 13 is reduced to increase the fill factor (FF), and the charge transfer efficiency from the second emitter and BSF regions 1212a and 1712a to the electrodes 141 and 142 increases to improve the efficiency of the solar cell 13.

Figure 13:
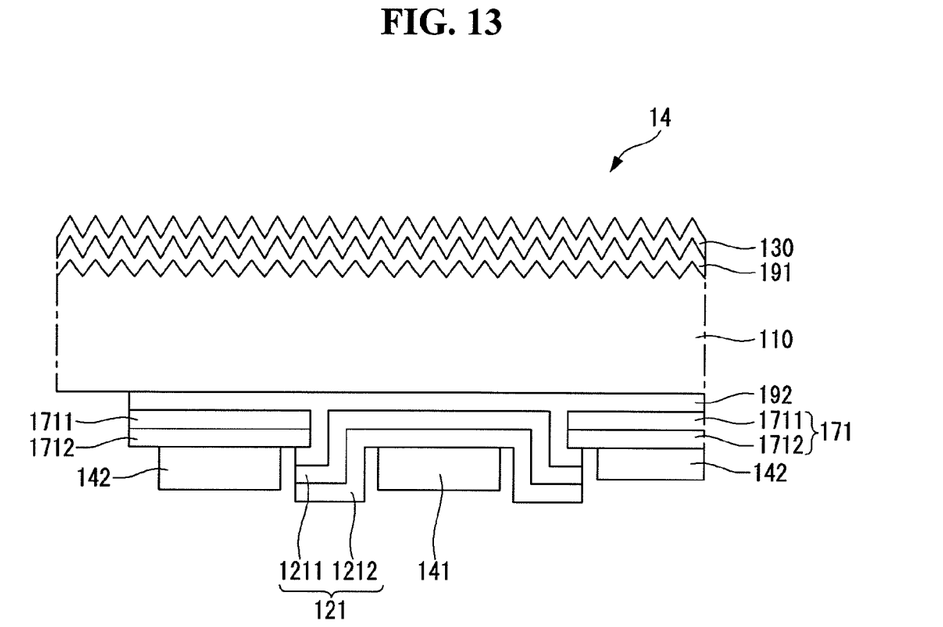
FIG. 13 is a cross-sectional view of another example embodiment of the invention.

With reference to FIG. 13, a solar cell according to another embodiment of the invention is described.

As compared with the solar cells 11 and 12 shown in FIGS. 1 to 3, the solar cell 13 of the example embodiment has an equal structure to the solar cells 11 and 12, except formation positions of the back buffer region 192 and the emitter regions 121.

Thereby, in the solar cell 14 shown in FIG. 13, a back buffer region 192 is positioned on the entire back surface of the substrate 110 like the solar cell 12 of FIG. 4. However, as shown in FIG. 13, in the solar cell 14, portions of the back buffer region 192 are further positioned between the emitter regions 121 and the BSF regions 171, which are adjacent to each other, and on portions of adjacent second BSF portions 1712 of the BSF regions 171. Thereby, portions of the back buffer region 192 overlap portions of the second BSF regions 1712. In this instance, ends of the portions of the back buffer region 192 and the emitter regions 121 positioned on the portions of the back buffer region 192b are positioned at the same position as each other.

Thereby, the back buffer region 192 is further positioned between each BSF region 171 and each emitter region 121 and between overlapping second BSF regions 1712 and the first emitter portions 1211. In this instance, the back buffer region 192 is made of non-conductive material. Thereby, the BSF regions 171 and the emitter regions 121 that are overlapped with each other are electrically disconnected by the back buffer region 192 of the non-conductive material.

Since portions of the BSF region 171 are protected by the back passivation region 192b, a change in the characteristics of the BSF regions 171 by moisture or air is reduced.

Like the solar cell 13 of FIGS. 4 and 5, the solar cell 14 according to the example embodiment may have a plurality of protrusions at surfaces of the second emitter portions 1212 and the second BSF portions 1712 contacting with the electrodes 141 and 142, and the surfaces of the second emitter portions 1212 and the second BSF portions 1712 are uneven surfaces.

Thereby, a contact area and a bonding strength between the second emitter and BSF portions 1212 and 1712 and the electrodes 141 and 142 increase to improve an efficiency of the solar cell 14.

Further, the solar cell 14 may further include the FSF region 170 on the front surface of the substrate 110.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
a substrate having a first conductivity type and made of crystalline semiconductor;
an emitter region including a first emitter portion formed of an amorphous semiconductor and a second emitter portion formed of a crystalline semiconductor, the first emitter portion and the second emitter portion each having a second conductivity type opposite the first conductivity type and forming a p-n junction with the substrate;
a surface field region including a first surface field portion formed of an amorphous semiconductor and a second surface field portion formed of a crystalline semiconductor and being separated from the emitter region, the first surface field portion and the second surface field portion each having the first conductive type;
a first buffer region positioned between the emitter region and the substrate and between the surface field region and the substrate;
a first electrode being directly contacted with the second emitter portion of the emitter region; and
a second electrode being directly contacted with the second surface field portion of the surface field region.

2. The solar cell of claim 1, wherein each of the first emitter portion and the first surface field portion directly contact the first buffer region.

3. The solar cell of claim 2, wherein at least one of a surface of the second emitter portion and the second surface field portion, which is in contact with at least one of the first electrode and the second electrode is an uneven surface of a plurality of protrusions.

4. The solar cell of claim 3, wherein the second emitter portion and the second surface field portion have surface roughness of substantially 1.5 nm to 10 nm.

5. The solar cell of claim 3, wherein the plurality of protrusions has a maximum height of substantially 15 nm to 40 nm.

6. The solar cell of claim 1, wherein the second emitter portion and the second surface field portion are one of microcrystalline silicon and nanocrystalline silicon.

7. The solar cell of claim 1, wherein the first emitter portion and the first surface field portion have a thickness of about 3 nm to 10 nm.

8. The solar cell of claim 1, wherein the second emitter portion and the second surface field portion have a thickness of about 2 nm to 25 nm.

9. The solar cell of claim 1, wherein the second emitter portion and the second surface field portion have a crystallinity of substantially 10 vol % to 90 vol %.

10. The solar cell of claim 1, wherein the emitter region and the surface field region are positioned on a surface of the substrate, which is opposite to an incident surface of the substrate.

11. The solar cell of claim 10, wherein the first buffer region is further positioned on the substrate between the emitter region and the surface field region.

12. The solar cell of claim 11, wherein the first buffer region is further positioned between the surface field region and the emitter region that are adjacent to each other.

13. The solar cell of claim 12, wherein the emitter region is overlapped with the surface field region and the first buffer region is positioned between overlapped portions of the emitter region and the surface field region.

14. The solar cell of claim 10, wherein the first buffer region is made of amorphous silicon.

15. The solar cell of claim 10, further comprising a second buffer region positioned on the incident surface.

16. The solar cell of claim 15, wherein the second buffer region is made of a same material as the first buffer region.

17. The solar cell of claim 15, further comprising an anti-reflection layer positioned on the second buffer region.

18. The solar cell of claim 1, wherein a thickness of the second emitter portion differs from a thickness of the second surface field portion.

19. The solar cell of claim 18, wherein when the first conductivity type is of an n-type, the thickness of the second surface field portion is less than the thickness of the second emitter portion.

20. The solar cell of claim 1, wherein a thickness of at least one of the second emitter portion and the second surface field portion differs from a thickness of the at least one of the first emitter portion and first surface field portion.

21. The solar cell of claim 1, wherein the first and second electrodes are made of a transparent conductive material.

22. The solar cell of claim 21, further comprising a third electrode and a fourth electrode positioned on the first electrode and the second electrode, respectively, and the third and fourth electrodes are made of a conductive material.

23. The solar cell of claim 1, wherein the first and second electrodes are made of a conductive metal material.

* * * * *